(12) United States Patent
Kanakasabapathy et al.

(10) Patent No.: US 8,753,934 B2
(45) Date of Patent: Jun. 17, 2014

(54) STRUCTURE AND METHOD TO INTEGRATE EMBEDDED DRAM WITH FINFET

(75) Inventors: Sivananda Kanakasabapathy, Niskayuna, NY (US); Hemanth Jagannathan, Guilderland, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 13/612,069

(22) Filed: Sep. 12, 2012

(65) Prior Publication Data

US 2013/0005129 A1    Jan. 3, 2013

Related U.S. Application Data

(63) Continuation of application No. 12/755,487, filed on Apr. 7, 2010, now Pat. No. 8,421,139.

(51) Int. Cl.
*H01L 21/48* (2006.01)
(52) U.S. Cl.
USPC ........... 438/249; 438/243; 438/259; 438/270; 257/E21.654; 257/E27.091; 257/E27.092; 257/E29.346; 257/E29.255
(58) Field of Classification Search
USPC .................. 438/243–249, 259, 270, 271; 257/E21.654, 27.091–27.092, 29.255, 257/346
See application file for complete search history.

(56) References Cited

U.S. PATENT DOCUMENTS

| | | | | |
|---|---|---|---|---|
| 6,977,404 | B2* | 12/2005 | Katsumata et al. | 257/301 |
| 6,998,676 | B2* | 2/2006 | Kondo et al. | 257/329 |
| 7,811,881 | B2* | 10/2010 | Cheng et al. | 438/248 |
| 7,898,014 | B2* | 3/2011 | Cheng et al. | 257/302 |
| 8,421,139 | B2* | 4/2013 | Kanakasabapathy et al. | 257/296 |
| 2008/0318377 | A1* | 12/2008 | Lee et al. | 438/243 |
| 2013/0307121 | A1* | 11/2013 | Basker et al. | 257/534 |

* cited by examiner

*Primary Examiner* — Michael Lebentritt
(74) *Attorney, Agent, or Firm* — Thomas Grzesik; Fleit Gibbons Gutman Bongini & Bianco PL

(57) ABSTRACT

Various embodiment integrate embedded dynamic random access memory with fin field effect transistors. In one embodiment, a first fin structure and at least a second fin structure are formed on a substrate. A deep trench area is formed between the first and second fin structures. A high-k metal gate is formed within the deep trench area. The high-k metal gate includes a high-k dielectric layer and a metal layer. A polysilicon material is deposited within the deep trench area adjacent to the metal layer. The high-k metal gate and the polysilicon material are recessed and etched to an area below a top surface of a substrate insulator layer. A poly strap is formed in the deep trench area. The poly strap is dimensioned to be below a top surface of the first and second fin structures. The first and second fin structures are electrically coupled to the poly strap.

7 Claims, 12 Drawing Sheets

STRUCTURE AND METHOD TO INTEGRATE EMBEDDED DRAM WITH FINFET

CROSS-REFERENCE TO RELATED APPLICATIONS

This application is continuation of and claims priority from U.S. patent application Ser. No. 12/755,487 filed on Apr. 7, 2010, now U.S. Pat. No. 8,421,139; the entire disclosure is herein incorporated by reference in its entirety.

FIELD OF THE INVENTION

The present invention generally relates to the field of semiconductors, and more particularly relates to embedding DRAM with FinFETs.

BACKGROUND OF THE INVENTION

It is a common practice to integrate memory and logic functions on a common semiconductor substrate. In such a configuration, when the memory function is performed by a dynamic random access memory (DRAM) cell, the circuitry is referred to as embedded DRAM (eDRAM).

The use of eDRAM as microprocessor cache, however, involves making tradeoffs between performance parameters, such as speed, retention time and power consumption, and production parameters, such as yield and design complexity. Due to their small sizes, memory cells are especially susceptible to process-induced variations, which worsen these tradeoffs and compromise memory cell functionality. Thus, steps need to be taken to minimize process-induced variations.

The use of undoped channel devices such as fin-field effect transistors (FinFETs) for memory (both static random access memory (SRAM) and DRAM) has been proposed for this reason. However, the integration of FinFETs with planar logic is difficult due to vertical topography, especially since DRAM processes generally rely on bulk silicon wafer substrates. Various problems in extrapolating planar DRAM technology to FinFETs lie in the fact that there is no unprocessed side to the body of the transistor where the capacitor can be strapped to. Also, the thin body of the Fin allows for very little overlap area for intimate electrical contact. The tight overlap requirements for deep trench to fin alignment is exacerbated by the planarity requirements of a Side wall Image Transfer (SIT) process required to obtain sub-lithographic Fin pitches. As such, conventional techniques are unable to use FinFETs for eDRAM.

SUMMARY OF THE INVENTION

In one embodiment, a method for integrating embedded dynamic random access memory with fin field effect transistors is disclosed. The method comprises forming a first fin structure and at least a second fin structure on a substrate. A deep trench area is formed between the first fin structure and second fin structure. The deep trench area extends through an insulator layer of the substrate and a semiconductor layer of the substrate that is below the insulator layer. A high-k metal gate is formed within the deep trench area. The high-k metal gate comprises a high-k dielectric layer and a metal layer. A polysilicon material is deposited within the deep trench area adjacent to the metal layer. The high-k metal gate and the polysilicon material are recessed and etched to an area below a top surface of the insulator layer. A poly strap is formed in the deep trench area on top of the high-k metal gate and the polysilicon material that have been etched and recessed. The poly strap is dimensioned to be below a top surface of the first fin structure and the second fin structure. The first fin structure and the second fin structure are electrically coupled to the poly strap.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
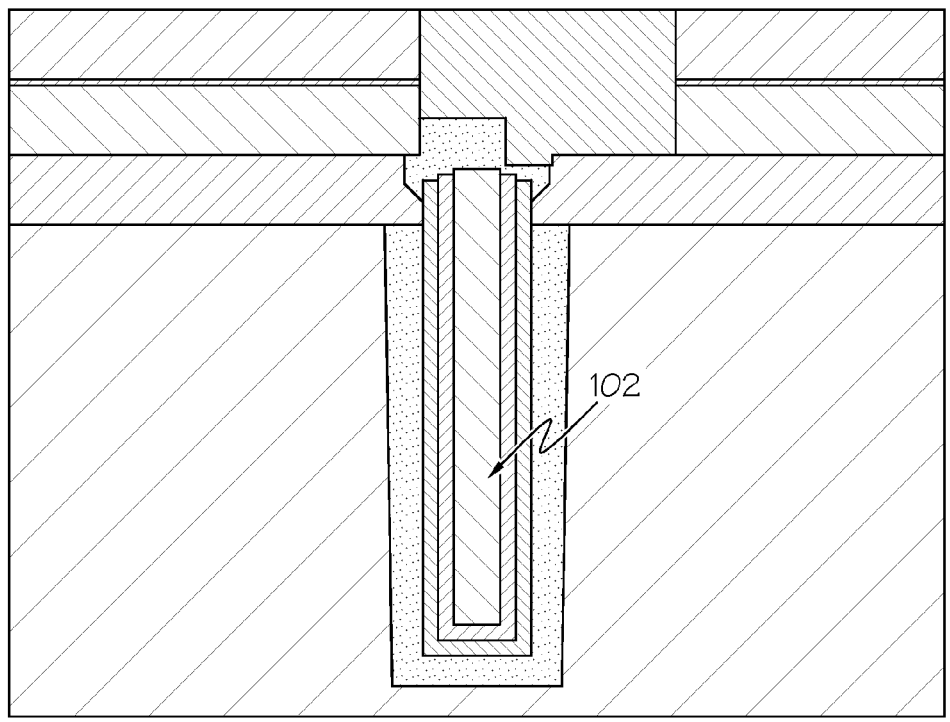
FIG. 1 illustrates a planar CMOS structure fabricated using a prior art fabrication process.

As discussed above, various problems exist when trying to extrapolate planar DRAM technology to FinFETs. FIG. 1 shows the current state of the art for planar CMOS where the DT (Deep Trench) module is formed prior to STI Level (recessed oxide). The eDRAM capacitor 102 shown in FIG. 1 is fabricated to butt the edge of what will be a piece of STI LEVEL using a poly strap. STI LEVEL level resist or organic planarizing layer (OPL) protects the DT 102 during STI LEVEL RIE. The DT 102 is buried under STI Oxide and, therefore, is protected from well levels and gate (PC) level processing. This conventional process is unable to integrate DT with a thin body finFET device where there is no STI and the STI LEVEL (or Fin) definition is through a SIT process. This is because the SIT process does not have a mask to protect areas such as the DT in the field.

However, as will be discussed in greater detail below, various embodiments of the present invention overcome these problems using a process that self-aligns the trench capacitor to the fins by exploiting the fin topography and, thereby, relaxing the lithographic overlay tolerance. One or more embodiments also achieve electrical contact to the deep trench (DT) and the fin by one of two techniques as opposed to "strapping". As will be shown below, various embodiments utilize a fin first, DT next, and PC last process or a Fin First, PC next, and DT last process. In the first process the fin module is formed first. A matrix fill (e.g., gap fill dielectric or HARP oxide) is deposited and a planarizing polish is performed. Alternatively, another process is to polish stop on a fin nitride hard mask (HM) and redeposit gap fill dielectric/HARP oxide. The DT is then formed and is self-aligned using self-aligned spacers around the Fin and Fin wrap around through SIT. For example, a partially self-aligned DT etch is performed where DT to FN alignment has a 3σ tolerance that is relaxed by (Spacer CD+½ Fin CD). In the other process, the fins are formed and then PC process is performed. Then the above DT fabrication process is performed.

Figure 2:
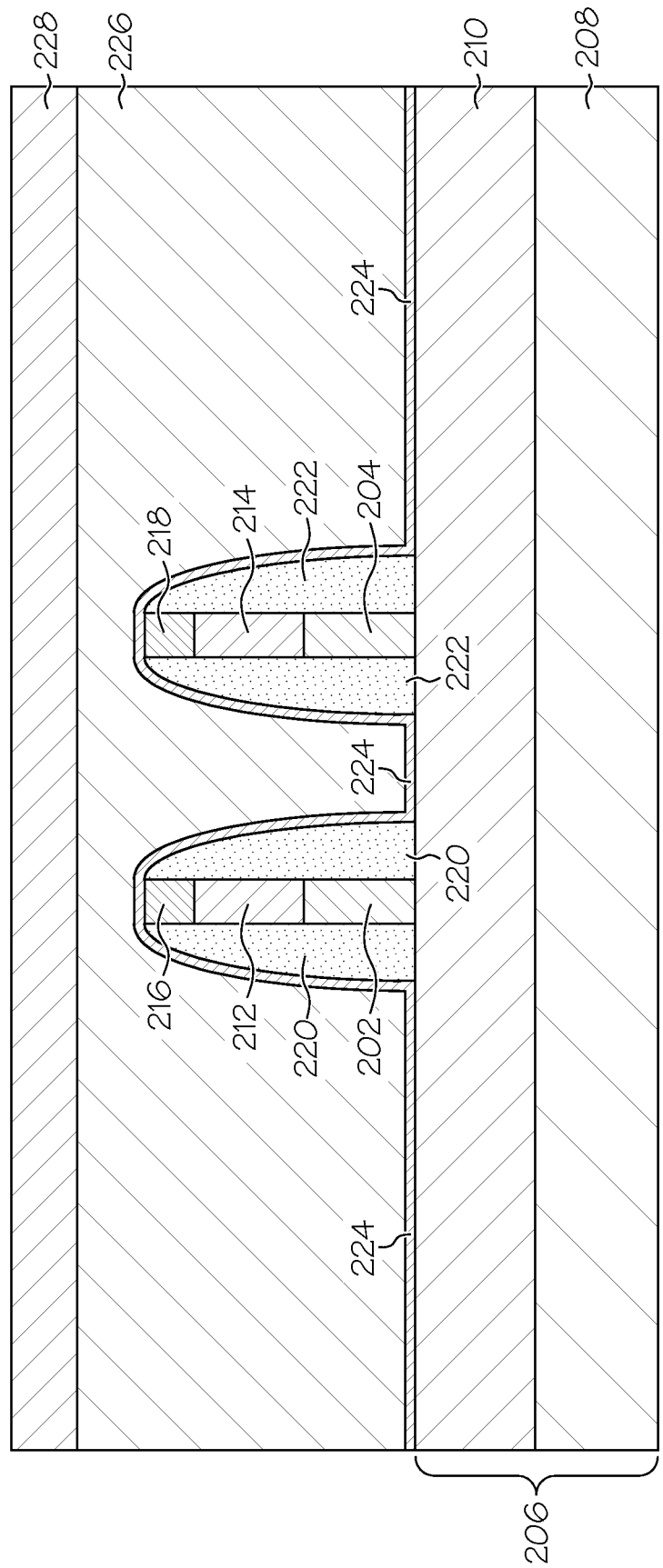
FIGS. 2-11 are cross-sectional views of a process for integrating eDRAM with FinFETs according to an embodiment of the present invention.

FIGS. 2-11 show one example of integrating eDRAM with FinFETs. It should be noted that FIGS. 2-11 begin after a process for forming Fin modules has been performed. Therefore, a process for forming the fin modules is not given in detail. Any process can be used to form the fins 202, 204. One example of a process for forming the fins is as follows. FIG. 2 shows that at least two fins 202, 204 have form formed. The fins 202, 204 have been formed on a substrate 206 that comprises a substrate 208 that underlies a buried insulator 210 that one point was underlying SOI layer, which was subsequently etched during the fabrication of the fins 202, 204. The fins 202, 204 were created from this second semiconductor layer. The substrate 206, for example, can have a single crystal SOI wafer. It is noted, however, that other substrate embodiments, such as, for example, a non-SOI wafer, may also be used.

The substrate 208 can be made of any appropriate semiconductor material including, but not limited to: Si, Ge, GaP, InAs, InP, SiGe, GaAs, or other III/V compounds. For illustrative purposes only, substrate 208 can be a single crystal silicon. The insulator layer 210, in one embodiment, is formed on the substrate 208 using any of a variety of techniques. For example, a separation by implantation and oxidation (SIMOX) technique or wafer bonding and etch-back technique may be used. The insulator layer 210 can have any insulative material, such as, for example, buried oxide (BOX). However, any other type and/or combination of buried insulator material may also be used for the insulator layer 210.

The second semiconductor layer, which has been removed, was formed on the insulator layer 210 by any applicable technique. The second semiconductor layer can, similar to the substrate 208, be made of any semiconductor material (e.g., Si, Ge, GaP, InAs, InP, SiGe, GaAs, or other III/V compounds).

The fins 202, 204 can be formed using any applicable technique. For example a hard mask film 212, 214 can be deposited on the second semiconductor layer to act as an etch stop layer that can be used, as needed, throughout the vertical fin fabrication process. The hard mask film 212, 214, in one embodiment, is comprised of silicon dioxide ($SiO_2$) or silicon nitride ($Si_3N_4$).

A workpiece can then be provided above the hard mask film 212, 214. The hard mask film 212 was patterned or etched using any applicable technique. For example, patterning and/or etching using a sidewall image transfer (SIT) can be used to generate any pattern or patterns of narrow and/or broad lines on the workpiece for forming the fins 202, 204. It should be noted that SIT is one example of a process to produce fins at a sub-lithographic pitch to achieve a high density of fins.

After the hard mask film 212, 214 and the second semiconductor layer (i.e., the SOI layer) are patterned, the patterning films used in SIT can be removed. This results in the vertical fins 202, 204 shown in FIG. 2. These fins 202, 204 comprise of portions of the second semiconductor layer. Each fin 202, 204 comprises the hard mask 212, 214 formed on a top surface thereof. A fin cap layer 216, 218 can be formed on a top surface of the hard mask 212, 214. Each vertical fin 202, 204 has opposing vertical sidewalls or surfaces that are substantially perpendicular to horizontal surface of the insulator layer 210. Self-aligned spacers 220, 222 were formed around the fin structure comprising the fins 202, 204, hard mask 212, 214, and gate mask 216, 218. In one embodiment, the fin caps 216, 218 and the self-aligned spacers 220, 22 comprise of substantially the same material. Once the self-aligned spacers 220, 222 were formed, a nitride liner 224 or any other liner material with a high etch resistance is formed over the fin structure comprising the self-aligned spacers 220, 222. A matrix fill 226 such as a gap fill dielectric is then deposited along with a deep trench resist/litho stack 228. Each of these two layers 226, 228 are then planarized. The resulting structure of this process is shown in FIG. 2. It should be noted that the process discussed above was only a general overview a fin fabrication process and any fin fabrication process is applicable to the present invention.

Figure 3:
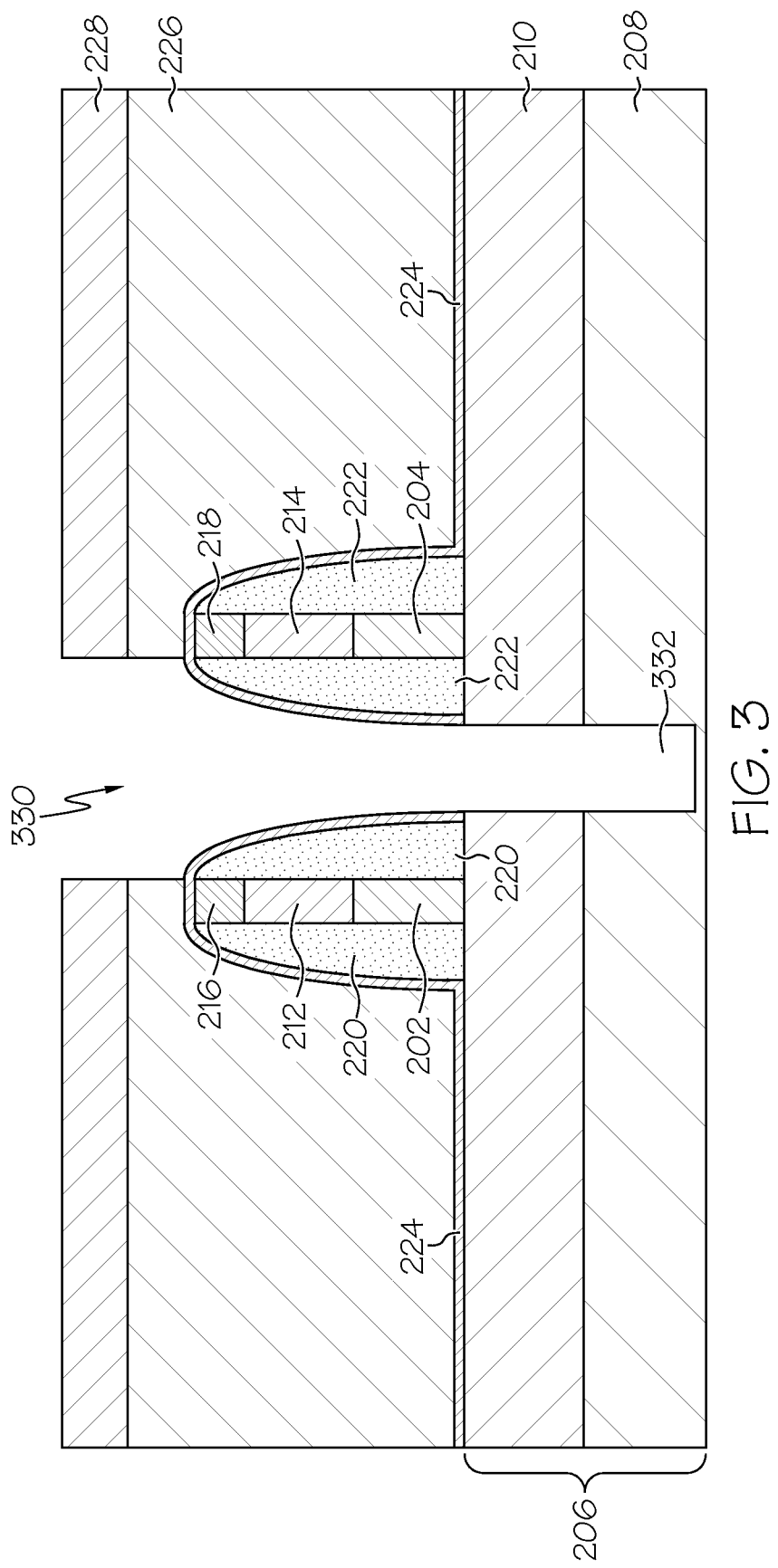

FIGS. 3-11 show a method and structure for integrating eDRAM with FinFETS once the fins are formed as shown in FIG. 2. Once the fins 202, 204 are formed, a lithography process is performed. This process etches into the DT resist/litho stack 228 and gap fill dielectric oxide layer 226 using a chemistry that selectively etches only the DT resist/litho stack 228, gap fill dielectric 226, the BOX 210, and semiconductor layer 208. In other words, this chemistry does not etch (or has a low etch rate) the spacer 220, 222 or hard mask 212, 214. Because the spacers 220, 222 are resistant to this etching process they self-align the via (deep trench) 330 to the midpoint 332 between the two fins 202, 204, as shown in FIG. 3.

Once the DT 330 is formed, the DT resist/litho stack 228 is removed and a high-k dielectric layer 434 is formed on top of the planarized gap fill dielectric oxide layer 226 and on the walls 436, 438, 440 of the via 330. This layer 434 can for coated by a variety of MOCVD and ALD techniques. One example is HfO2 through ALD using HfC14 as a pre-cursor. Examples of materials for this high-k metal oxide or metal oxynitride dielectric layer 434 are $HfO_2$, HfSiO, HfSiON, HfZrO, $TiO_2$, $La_2O_3$, $Y_2O_3$, $Al_2O_3$, and mixtures thereof. A metal layer 442 is then deposited and formed on the high-k dielectric layer 434. In one embodiment, the metal layer 442 is formed of a thermally stable metal, such as TiN, TaN, TaC, TiAlN, TaAlN, or their derivatives. The high-k dielectric layer 434 and metal layer 442 together form the MHK gate.

Figure 4:
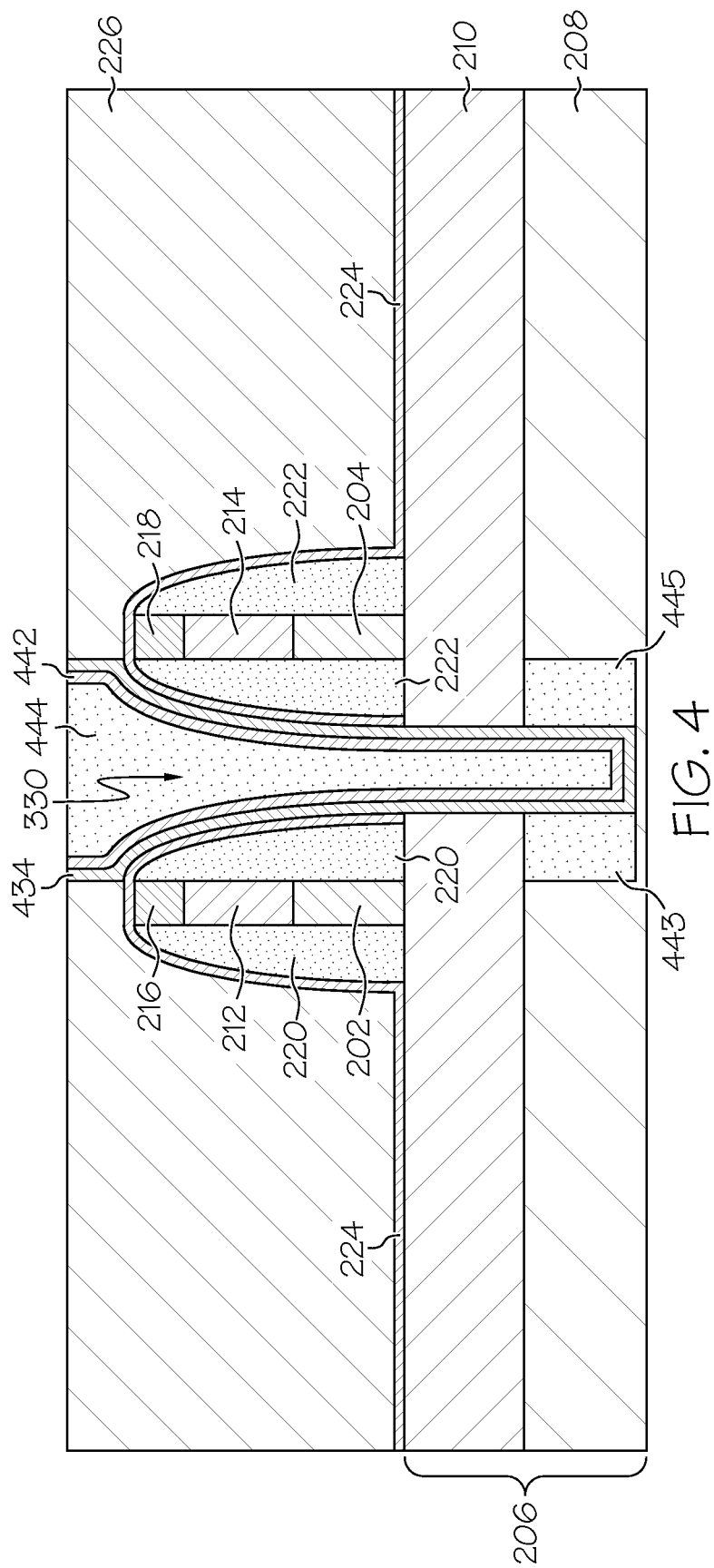

It should be noted that after the DT etch, the via 330 is subjected to an angle implantation process of a dopant resulting in doped regions 443, 445. This results in the sidewall of the capacitor having low resistance. The DT 330 is filled with polysilicon 444 or any other strap metal capable of high aspect ratio gap fill and resistant to erosion from subsequent CMOS processing, as shown in FIG. 4. This step hermetically seals the high-k dielectric material 434 and metal conducting layer 442. A planarization process such as CMP is performed to remove the high-k dielectric material 434, conducting material 442 and the polysilicon material 444 from the horizontal surfaces (e.g., the top surface of the planarized gap fill dielectric oxide 226 on the structure, as shown in FIG. 4. This results in the high-k dielectric material 434, conducting material 442 and the polysilicon material 444 being confined to the DT 330.

Next, a recess etching process is performed on the high-k dielectric layer 434, metal layer 442, and polysilicon 444.

Figure 5:
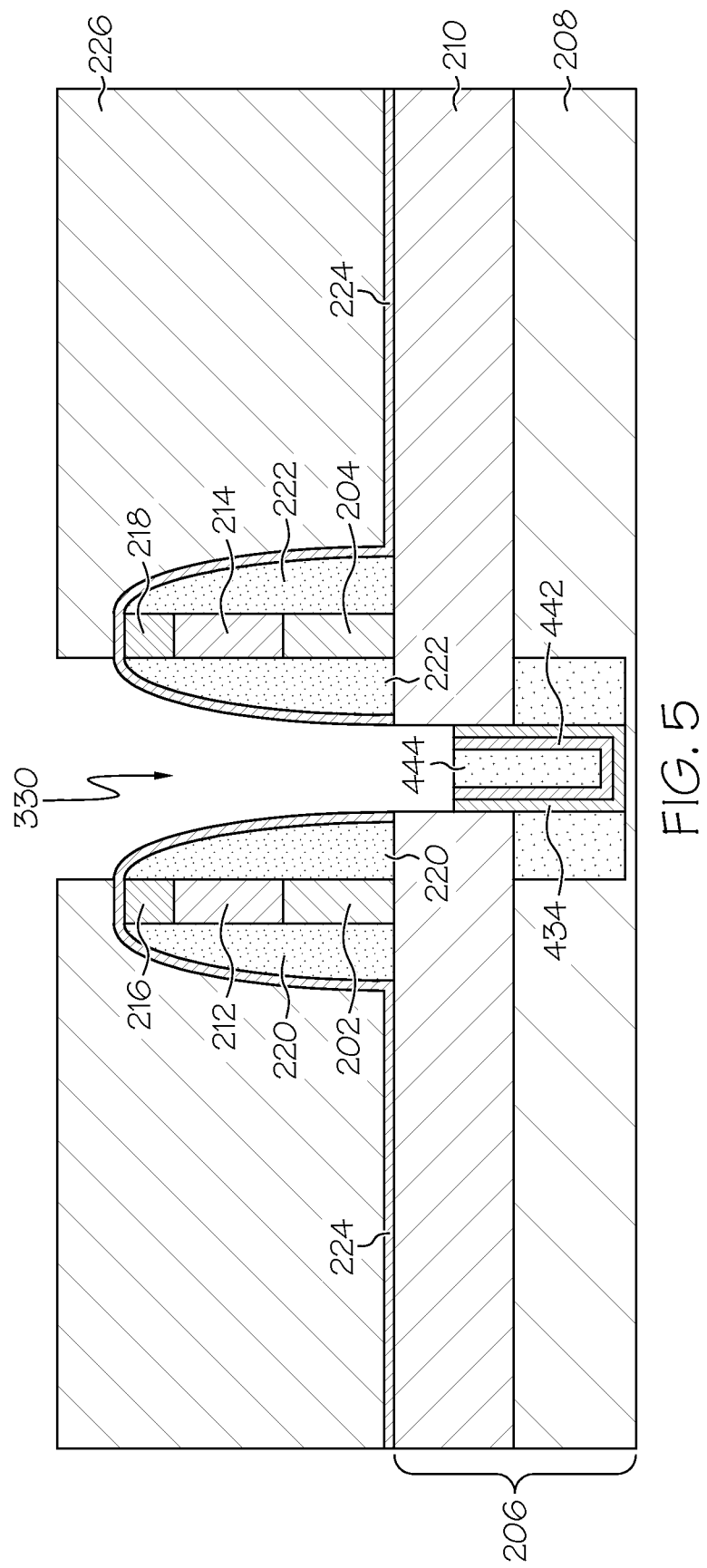
Figure 6:
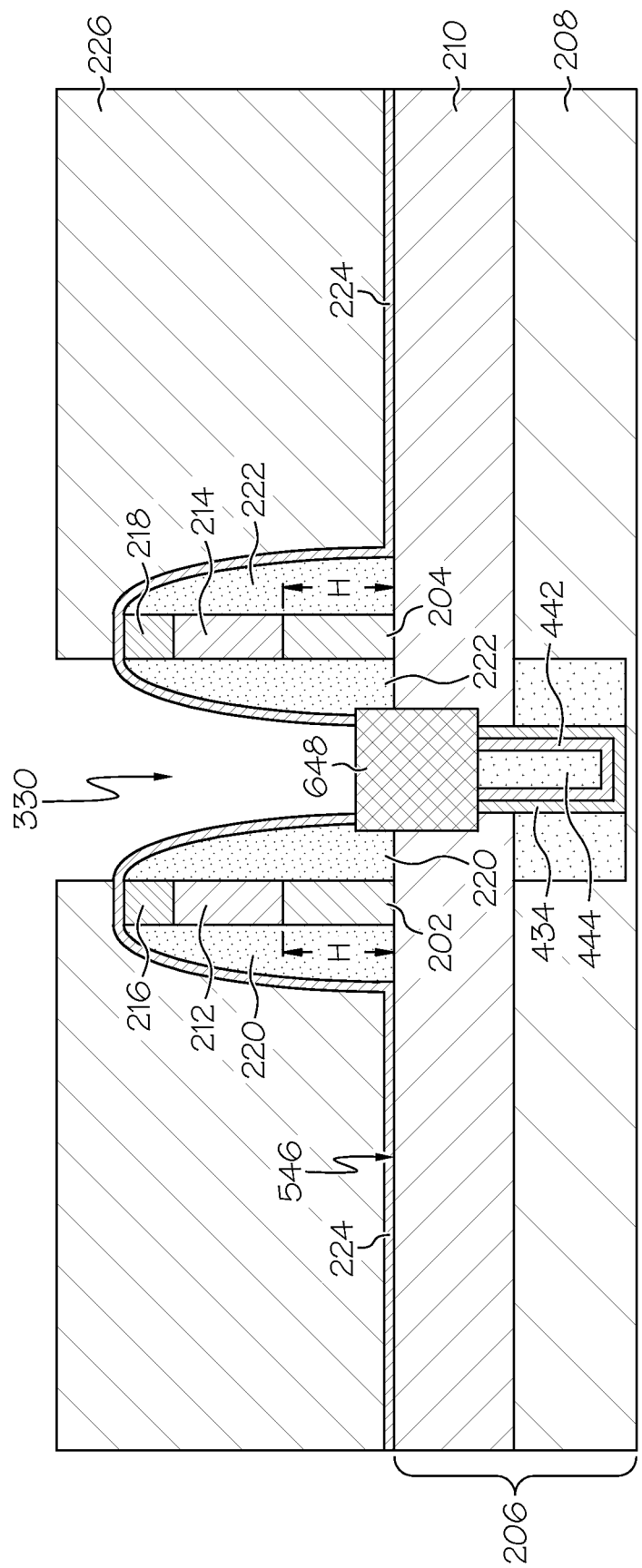

This process pulls these layers 434, 442, 444 within the BOX layer 210, i.e., underneath a top surface 546 of the BOX layer 210, as shown in FIG. 5. This allows the BOX layer 210 to insulate the capacitor from making uncontrolled contact with the fins. A poly strap 648 is then formed, as shown in FIG. 6 by depositing polysilicon into the via 330, planarizing the polysilicon, and etching the polysilicon back using a wet etch. The wet etching process is controlled such that the polysilicon material 648 is recessed beneath the height H of the fins 202, 204, but still confined to the DT 330. This "pull down" of the strap polysilicon 648 is configured to ensure that upon subsequent gate processing the strap polysilicon 648 is finally recessed just underneath a top surface 546 of the BOX layer 210. Also, BOX DT oxide flare to strap to FN is optionally not performed since the fin CD is small (approximately 12 nm).

Figure 7:
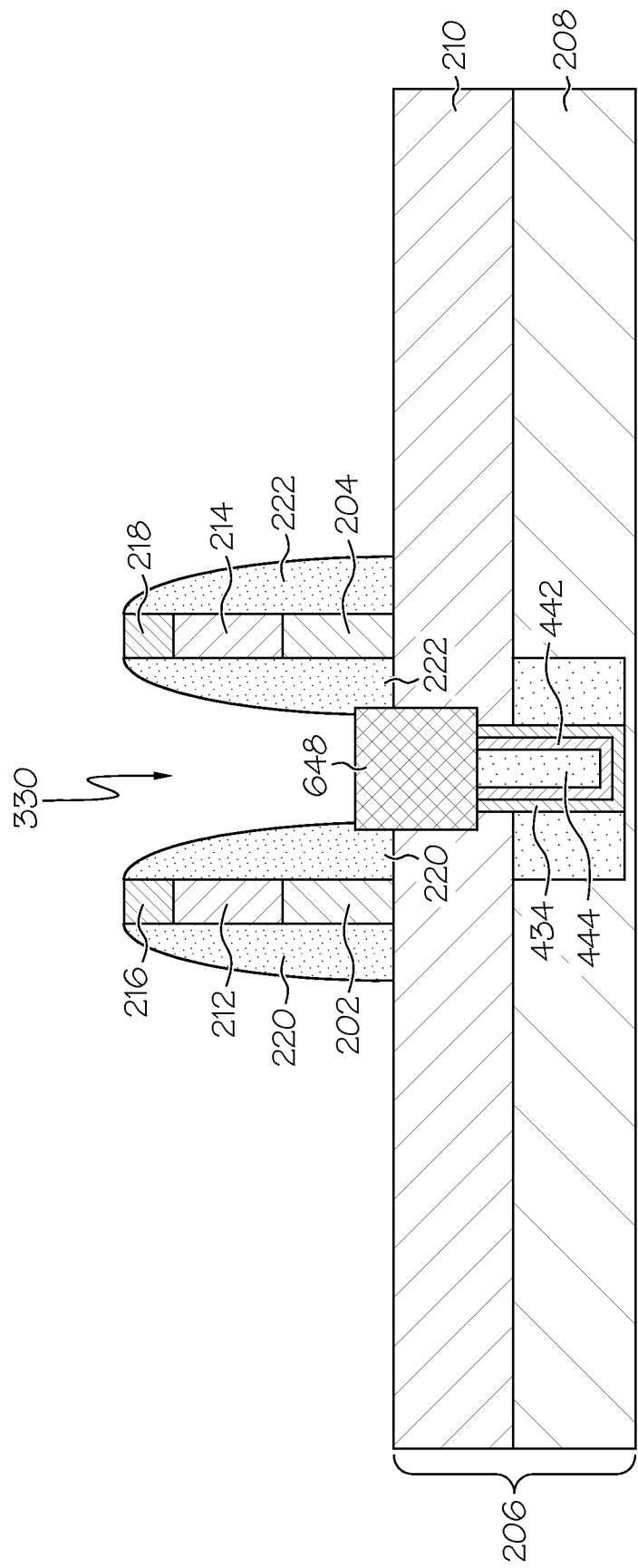

The planarized gap fill dielectric oxide 226 is then removed down to the BOX layer 210 using wet or dry etching process that is selective to the gap fill dielectric oxide 226, as shown in FIG. 7. Alternatively, a nitride liner post spacer etch can be used to assist with selectively removing the gap fill dielectric oxide 226. Therefore, in one embodiment, the nitride liner 224 is not removed, while in another embodiment the nitride liner 224 is removed.

Figure 8:
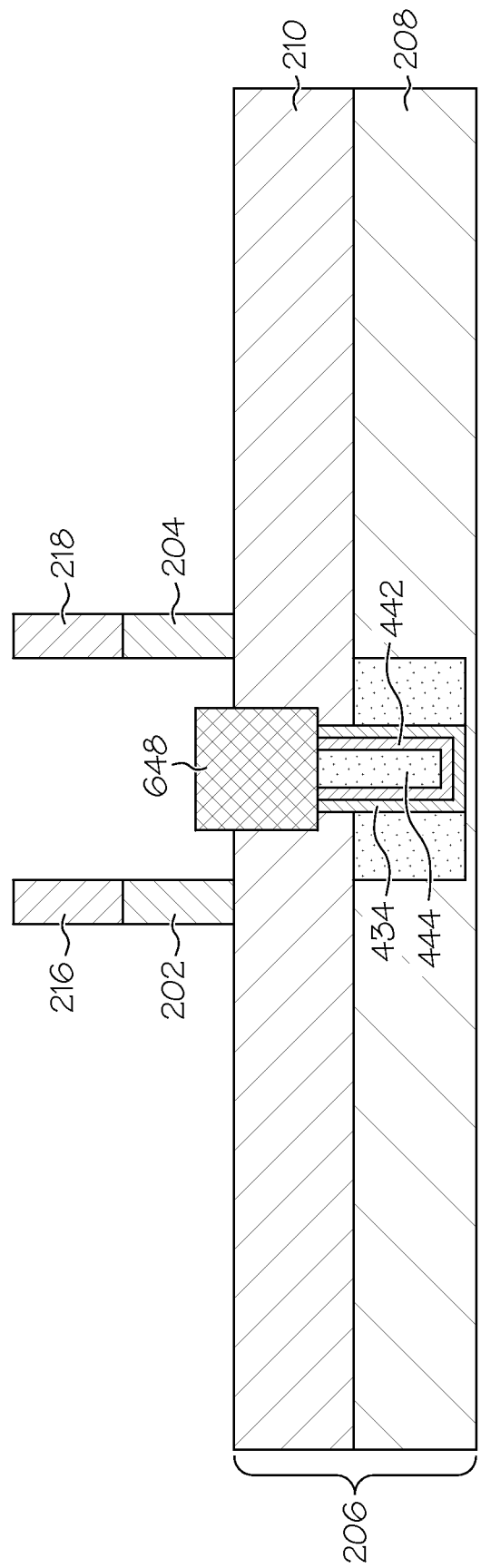
Figure 9:
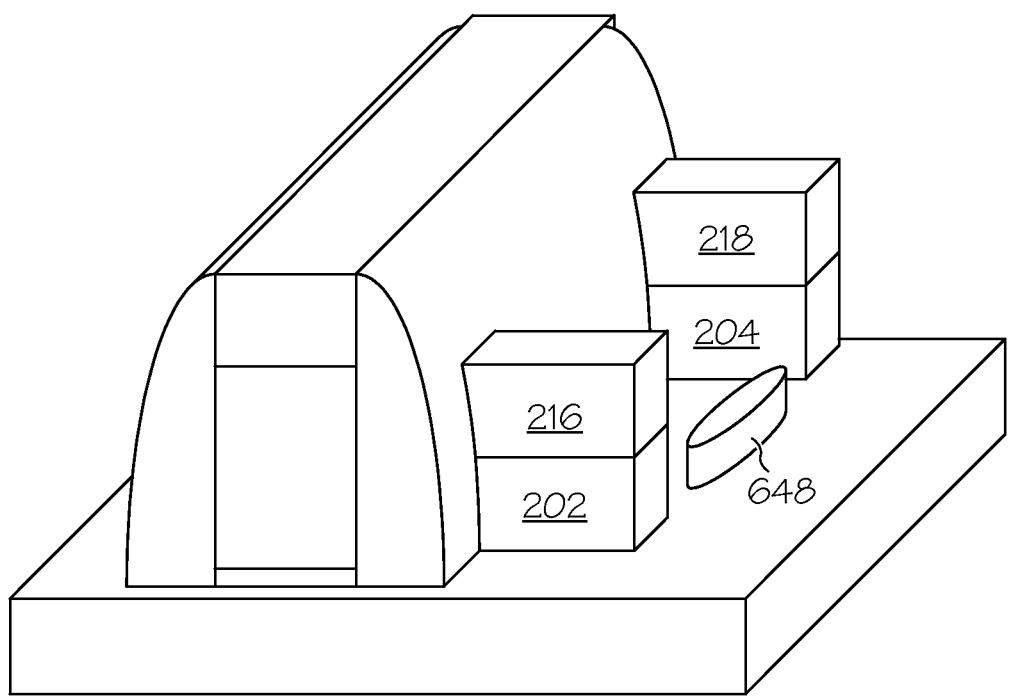

Once the gap fill dielectric oxide 226 has been removed, the spacers 220, 222 and the fin cap/gate mask 216, 218 are selectively removed using a hot phosphoric acid chemistry or any other chemistry that is selective to these materials, as shown in FIG. 8. FIG. 9 shows three-dimensional view of the structure after the spacers 220, 222 and the fin cap/gate mask 216, 218 are selectively removed and with additional processing (gate and extension level processing) such as gate formation and spacer formation around the gate for source/drain extension formation. As can be seen form FIG. 9, the DT poly stump 648 out in the field that is aligned between the two fins 202, 204.

The process discussed above formed the DT 648 after the fins were formed, but prior to gate level processing. In other embodiment, the fins are formed first, as discussed above, but the gate level processing is performed prior to the DT formation. In this embodiment, the PC is formed after the fin modules are formed with self-aligned spacers. The gate stack is deposited and the PC is etched. A nitride spacer is deposited for protection from subsequent DT processing. DT formation can then be performed as discussed above with respect to FIGS. 2-8. Since the gate level processing was already performed prior to forming the DT, gate level processing, in this embodiment, is not required after forming the DT as in the embodiment discussed above.

Figure 10:
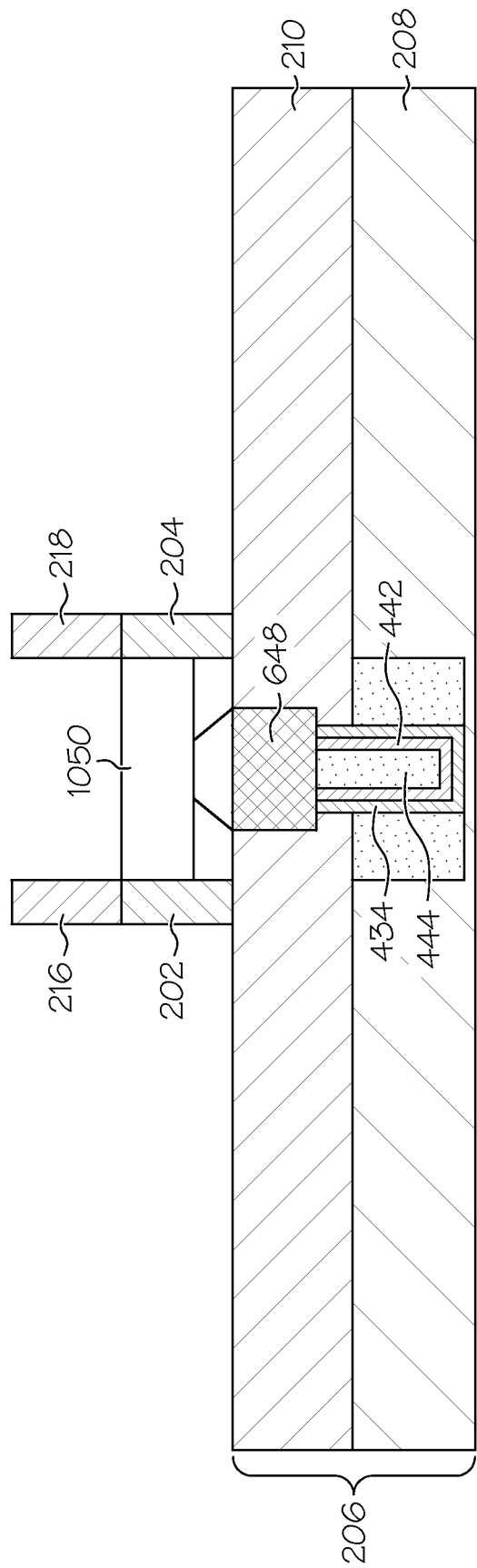

The fins 202, 204 are then electrically coupled to the DT 648 as follows. In one embodiment, an epitaxial merging process is performed. This process epitaxially merges the fins 202, 204 with each other and the DT stump 648 A selective epitaxial process is then performed to grow a region of material 1050 from the DT polysilicon stump 648, as shown in FIG. 10. The DT polysilicon stump 648 is used as the template for growing the region of material 1050. This region of material 1050 has the same crystalline structure as the DT polysilicon stump 648. Alternatively, the sidewall of the first and/or second fin 202, 204 can be used to epitaxially grow the region of material 1050. In this embodiment, the region of material 1050 has the same crystalline structure as the fin sidewall. The material 1050 couples the fins 202, 204 to each other and to the polysilicon stump 648.

Figure 11:
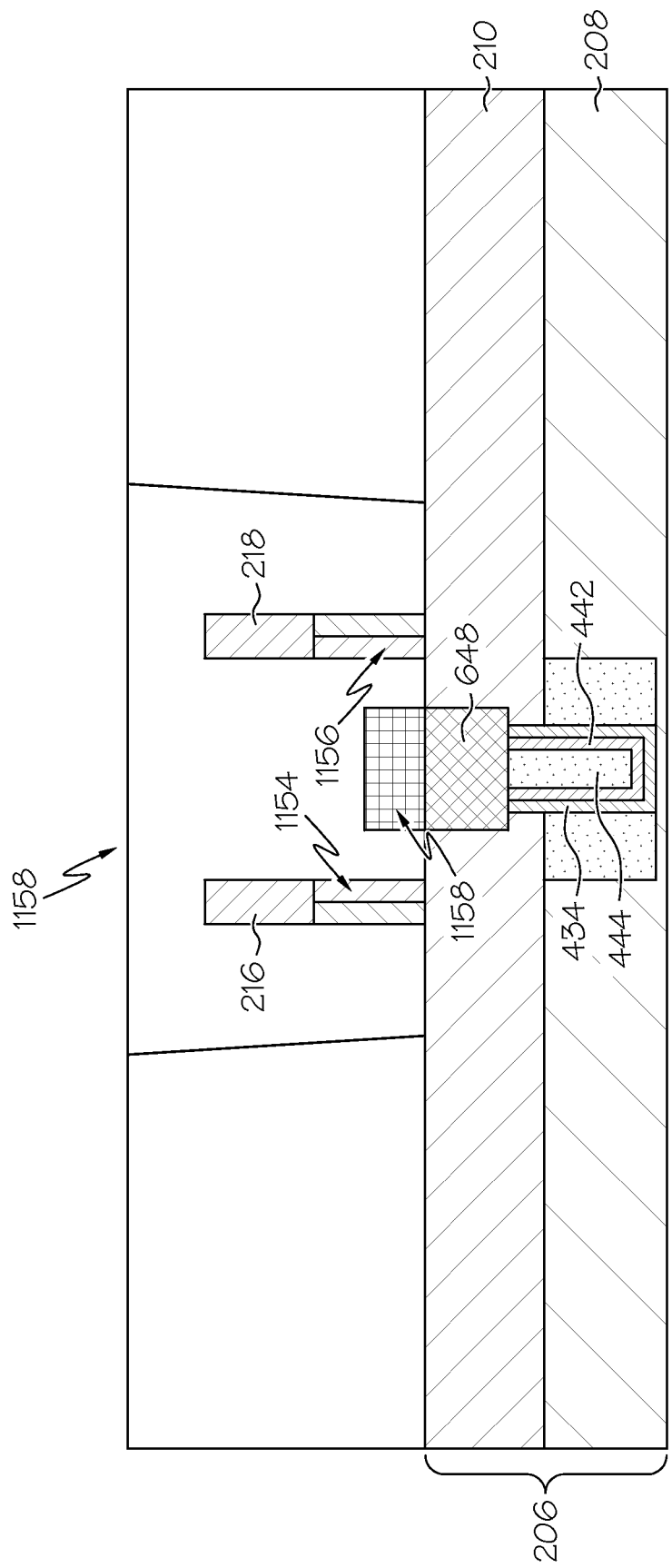

In another embodiment, after a MOL dielectric 1152 is deposited over the structure on top of the BOX layer 210 the fins 202, 204 and the fins 202, 204 and the DT polysilicon stump 658 are either partially or fully silicided 1154, 1156, 1158, as shown in FIG. 11. The silicidation process comprises the deposition of a metal that can form metallic alloys with Si such as, but not limited to, NiPt from nickel silicide. A portion 1160 of the MOL dielectric is etched and filled with a metallic material such as tungsten or copper. This metal filled region submerges the fins 202, 204 and DT polysilicon stump 648. The metal within the metal filled region 1158 couples to the silicided areas 1154, 1156, 1158 of the fins 202, 204 and DT polysilicon stump 648 forming a local interconnect. Conventional techniques can then be used to complete the fabrication process. It should be noted that the silicided region 1158 of the DT polysilicon stump 648 extends above the buried insulator layer 210 and also extends below the buried insulator layer 210.

Figure 12:
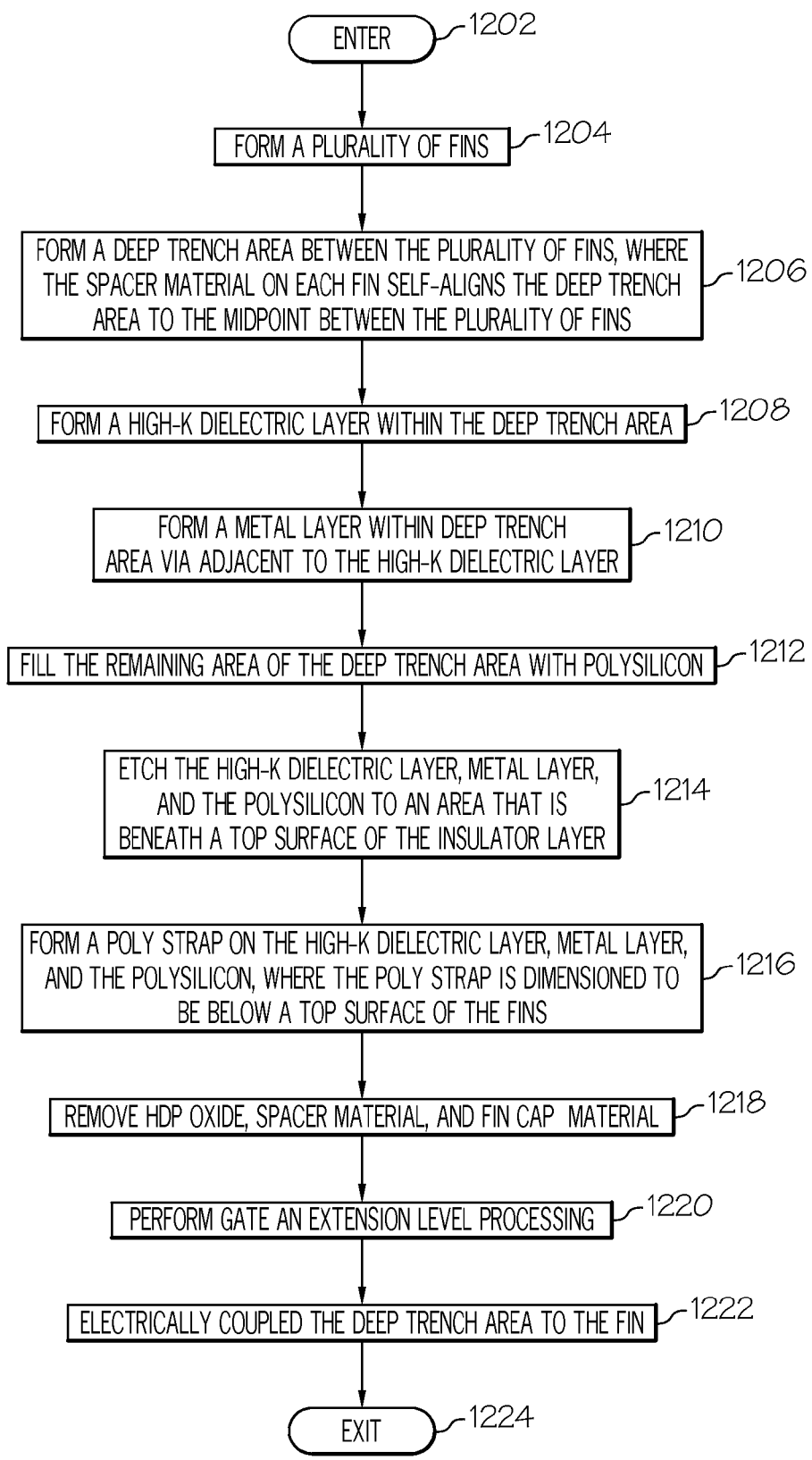
FIG. 12 is an operational flow diagram illustrating one example of integrating eDRAM with FinFETs according to an embodiment of the present invention.

FIG. 12 is an operational flow diagram illustrating one example of integrating eDRAM with Finfets. The operational flow diagram of FIG. 12 begins at step 1202 and flows directly into step 1204. A plurality of fins 202, 204, at step 1204, is formed, as discussed above with respect to FIG. 2. A deep trench area 330, at step 1206, is formed between the plurality of fins 202, 204. The spacer material 220, 222 wrapping each fin 202, 204 self-aligns the deep trench area 330 to the midpoint 332 between the plurality of fins 202, 204. It should be noted that in another embodiment, as discussed above, gate level processing can be performed after the fins are formed and then the DT area 330 is formed.

A high-k dielectric layer 434, at step 1208, is formed within the deep trench area 330. A metal layer 442, at step 1210, is formed within the deep trench area 330 adjacent to the high-k dielectric layer 434. The remaining area of the deep trench area 330, at step 1212, is filled with polysilicon 444. The high-k dielectric layer 434, metal layer 442, and polysilicon 444, at step 1214, are etched to an area that is beneath a top surface 546 of the insulator layer 210. A poly strap 648, at step 1216, is formed, on the high-k dielectric layer 434, metal layer 442, and polysilicon 444. The poly strap 648 is dimensioned to be below a top surface of the fins 202, 204. Next, the gap fill dielectric oxide layer 226, spacer material 220, 222, and fin cap material 216, 218, at step 1218, are removed. Gate level and extension processing, at step 1220, is performed. However, as discussed above, gate level processing can be performed after the fins are forms, but prior to the DT being formed. In this embodiment, only extension processing at step 1220 is performed. The DT area 330, at step 1222, is electrically coupled to the fins 202, 204. The control flow then exits at step 1224.

As can be seen from the above discussion, one or more embodiments of the present invention integrate eDRAM with FinFETS by using a process that self-aligns the trench capacitor to the fins by exploiting the fin topography and, thereby, relaxing the lithographic overlay tolerance. One or more embodiments also achieve electrical contact to the deep trench (DT) and the fin by one of two techniques as opposed to "strapping".

It should be noted that the process discussed above with respect to FIGS. 2-12 can be performed by one or more information processing systems can comprise, inter alia, at least a computer readable storage medium allowing the computer to read data, instructions, messages or message packets, and other computer readable information from the computer readable storage medium to perform the process discussed above. The computer readable medium can comprise non-volatile memory, such as ROM, Flash memory, floppy disk, Disk drive memory, CD-ROM, and other permanent storage. Additionally, a computer readable medium can include, for example, volatile storage such as RAM, buffers, cache memory, and network circuits.

Furthermore, the computer readable medium can comprise computer readable information in a transitory state medium such as a network link and/or a network interface, including a wired network or a wireless network that allows a computer to read such computer readable information.

The embodiments of the present invention described above are meant to be illustrative of the principles of the present invention. Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as discussed above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A method for integrating embedded dynamic random access memory with fin field effect transistors, the method comprising:
    forming a first fin structure and at least a second fin structure on a substrate;
    forming a deep trench area between the first fin structure and second fin structure, wherein the deep trench area extends through an insulator layer of the substrate and a semiconductor layer of the substrate that is below the insulator layer;
    forming a high-k metal gate within the deep trench area, wherein the high-k metal gate comprises a high-k dielectric layer and a metal layer;
    depositing a polysilicon material within the deep trench area adjacent to the metal layer;
    etching and recessing the high-k metal gate and the polysilicon material to an area below a top surface of the insulator layer;
    forming a poly strap in the deep trench area on top of the high-k metal gate and the polysilicon material that have been etched and recessed, wherein the poly strap is dimensioned to be below a top surface of the first fin structure and the second fin structure; and
    electrically coupling the first fin structure and the second fin structure to the poly strap.

2. The method of claim 1, wherein a first sidewall spacer formed around the first fin structure and a second sidewall spacer formed around the second fin structure self-aligns the deep trench area to a midpoint between the first fin structure and the second fin structure.

3. The method of claim 1, further comprising:
    performing gate level and extension processing after forming the poly strap, but prior to electrically coupling the first fin structure the second fin structure to the poly strap.

4. The method of claim 1, further comprising:
    performing gate level processing after forming the first fin structure and the second fin structure, but prior to forming the deep trench area.

5. The method of claim 1, wherein the electrically coupling further comprises:
    epitaxially merging the first fin structure and the second fin structure to each other and the poly strap.

6. The method of claim 4, wherein the epitaxially merging further comprises:
    epitaxially growing a material from at least one of the first fin structure and the second fin structure, wherein this material epitaxially merges the first fin structure and the second fin structure to each other and the poly strap.

7. The method of claim 1, wherein the electrically coupling further comprises:
    siliciding at least a portion of the first fin structure, the second fin structure, and a portion of the poly strap that is above the insulator layer;
    depositing a middle-of-the-line dielectric material over a top surface of the insulator layer and the first fin structure, the second fin structure, and the portion of the poly strap;
    removing a region of the middle-of-the-line dielectric material comprising the first fin structure, the second fin structure, and the portion of the poly strap; and
    depositing a metallic material within the region over the first fin structure, the second fin structure, and the portion of the poly strap.

* * * * *